United States Patent
Pacilli et al.

(10) Patent No.: US 10,113,562 B2
(45) Date of Patent: Oct. 30, 2018

(54) AIR MOVER CIRCUITRY AND COMPLIANT MEMBER

(71) Applicant: GENTHERM AUTOMOTIVE SYSTEMS (CHINA) LTD., Langfang, Hebei (CN)

(72) Inventors: Chad Vincent Pacilli, Windsor (CA); Stephen Seguin, McGregor (CA); Loory (Rui) Wang, Minhang (CN)

(73) Assignee: GENTHERM AUTOMOTIVE SYSTEMS (CHINA) LTD., Langfang, Hebei (CN)

( * ) Notice: Subject to any disclaimer, the term of this patent is extended or adjusted under 35 U.S.C. 154(b) by 0 days.

(21) Appl. No.: 15/318,458

(22) PCT Filed: Jun. 19, 2014

(86) PCT No.: PCT/CN2014/080285
§ 371 (c)(1),
(2) Date: Dec. 13, 2016

(87) PCT Pub. No.: WO2015/192351
PCT Pub. Date: Dec. 23, 2015

(65) Prior Publication Data
US 2017/0146033 A1    May 25, 2017

(51) Int. Cl.
*H02K 7/14* (2006.01)
*F04D 29/66* (2006.01)
(Continued)

(52) U.S. Cl.
CPC ....... *F04D 29/668* (2013.01); *F04D 25/0693* (2013.01); *F04D 29/043* (2013.01); *H02K 7/14* (2013.01); *H02K 21/22* (2013.01)

(58) Field of Classification Search
CPC ........ F04D 25/06; F04D 29/043; F04D 29/66; F16B 21/00; F16B 21/07; F16C 35/063;
(Continued)

(56) References Cited

U.S. PATENT DOCUMENTS

| 4,773,828 A | 9/1988 | Hagiwara et al. |
| 4,885,488 A | 12/1989 | Cox |

(Continued)

FOREIGN PATENT DOCUMENTS

| CN | 1783655 | 6/2006 |
| CN | 101730438 | 6/2010 |

(Continued)

OTHER PUBLICATIONS

International Search Report and Written Opinion dated Mar. 24, 2015 for Application No. PCT/CN2014/080285.
(Continued)

*Primary Examiner* — Joshua Benitez Rosario
*Assistant Examiner* — Leda Pham
(74) *Attorney, Agent, or Firm* — The Dobrusin Law Firm, P.C.

(57) ABSTRACT

A blower (2) comprising: (a) a rotor (6) including: (i) a magnet (12) and (ii) a shaft (16) including a recess on an end of the shaft (16); (b) a stator (20) that at least partially extends within the rotor (6); and (c) a compliant member (26); wherein the compliant member (26) extends into the recess and the compliant member (26) is compliant so that the compliant member (26) allows the shaft (16) to move.

18 Claims, 4 Drawing Sheets

(51) Int. Cl.
*F04D 25/06* (2006.01)
*F04D 29/043* (2006.01)
*H02K 21/22* (2006.01)

(58) Field of Classification Search
CPC ........ F16C 35/04; H02K 5/173; H02K 5/167; H02K 21/11; H02K 5/16; H02K 11/00
USPC .......................................................... 310/67 R
See application file for complete search history.

(56) References Cited

U.S. PATENT DOCUMENTS

| | | | |
|---|---|---|---|
| 5,093,547 A | 3/1992 | Kusano et al. | |
| 5,254,968 A | 10/1993 | Zirnheld | |
| 5,258,672 A * | 11/1993 | Wrobel | F16B 21/078 |
| | | | 310/67 R |
| 5,979,541 A | 11/1999 | Saito | |
| 6,109,890 A * | 8/2000 | Horng | F04D 25/0633 |
| | | | 165/122 |
| 6,132,170 A | 10/2000 | Horng | |
| 6,509,704 B1 | 1/2003 | Brown | |
| 6,720,694 B2 * | 4/2004 | Horng | H02K 5/1675 |
| | | | 310/67 R |
| 7,659,648 B2 * | 2/2010 | Brown | F04D 29/051 |
| | | | 310/67 R |
| 8,324,767 B2 * | 12/2012 | Lee | G11B 19/2009 |
| | | | 310/67 R |
| 8,704,477 B2 | 4/2014 | Brown | |
| 9,127,691 B2 | 9/2015 | Hagan et al. | |
| 2008/0283216 A1 | 11/2008 | Horng et al. | |
| 2008/0286126 A1 * | 11/2008 | Eaton | F04B 9/14 |
| | | | 417/278 |
| 2012/0114512 A1 * | 5/2012 | Lofy | F04D 29/4226 |
| | | | 417/410.1 |
| 2013/0164158 A1 | 6/2013 | Matsuba et al. | |

FOREIGN PATENT DOCUMENTS

| | | |
|---|---|---|
| CN | 102042241 A | 5/2011 |
| DE | 3519536 | 12/1986 |
| JP | S 63-17566 U | 2/1988 |
| JP | 2013-542356 A | 11/2013 |

OTHER PUBLICATIONS

Korean Office Action dated Jul. 3, 2017 for Application No. 10-2016-7035056.
Japanese Office Action dated May 11, 2017 for Application No. 2016-574066.
Extended European Search Report for Application No. 14895470.4 dated Feb. 2, 2018.
Japanese Office Action for Application No. PCT/CN2014/080285 dated Nov. 10, 2017.

* cited by examiner

AIR MOVER CIRCUITRY AND COMPLIANT MEMBER

FIELD

The present teachings relate to an air mover with an improved circuitry design that improves efficiency of the air mover and a compliant member that reduces noise, vibrations, and harshness of the air mover in both a working state and an off state.

BACKGROUND

Air movers include a rotor and a stator. Generally, a shaft of the rotor extends through the stator and the rotor rotates about the stator. The shaft includes a groove at its base that receives a rigid retainer ring, C clamp, or the like so that the rigid retainer ring holds the shaft within the stator. The rigidity of the rigid retainer ring substantially holds the shaft axially in place, however, due to tolerance constraints of the rigid retainer ring, the shaft, and/or other components of the system, the shaft may axially move and contact one or more other components of the air mover such as the housing, causing noise and/or vibrations. Additionally, natural vibrations in the system during operation may be transferred through the shaft to the rotor or vice versa so that noise is created. The vibrations, noise, harshness, or a combination thereof caused by the axial movement of the shaft and/or transfer of vibrations may be heard and/or felt by an occupant, a user, or both. These vibrations, noise, or both may be undesirable to the user and may generate customer complaints, warranty claims, or both. Examples of retainer rings are disclosed in U.S. Pat. Nos. 4,773,828; 6,509,704; 7,659, 648 and U.S. Patent Application Publication No. 2012/0114512, the contents of which are expressly incorporated by reference herein in their entirety for all purposes.

Air movers include printed circuit boards that include circuitry for controlling the air mover. The circuitry, typically, is distributed about the printed circuit boards so that the circuitry controls one or more operations of the air mover, the distribution of the of the circuitry about the printed circuit board may result in less than optimal operation of the air mover and/or slow performance of the air mover during changes. The circuitry of the printed circuit boards, during operation, emits radiation (e.g., electromagnetic waves) and the emitted radiation may interfere with the operation of adjacent components, may affect performance of the blower, or both. Examples of circuitry of fans are disclosed in U.S. Pat. Nos. 4,773,828; 6,509,704; 7,659,648 and U.S. Patent Application Publication No. 2012/0114512 all of which are expressly incorporated by reference herein in their entirety for all purposes.

Air movers include a shaft that is connected to an impeller and/or cup. The impeller and/or cup house magnets that rotate the impeller during use. During manufacture of the air mover the shaft and impeller and/or cup are typically connected together. For example, the cup and shaft may be located relative to each other and an overmold may be applied that forms the impeller and connects the shaft and the cup. However, if the shaft and cup are not precisely aligned the impeller may vibrate, wobble, or both. Attempts have also been made to directly connect the cup to the shaft. Examples of connections of the shaft and cup and/or impeller are found in U.S. Pat. No. 5,093,547 and German Patent No. DE3519536 both of which are expressly incorporated by reference herein in their entirety for all purposes.

What is needed is an air mover that includes a compliant member that dampens axial movement of the shaft. What is needed is a compliant member connected to a shaft that prevents and/or eliminates noise, vibration, and harshness related to movement of the rotor. What is needed is an improved circuitry configuration that improves performance of the air mover. It would be desirable to have a circuitry configuration that reduces radiation such as electromagnetic waves generated by the air mover.

SUMMARY

The teachings herein surprisingly solve one or more of these problems by providing: a blower comprising: (a) a rotor including: (i) a magnet and (ii) a shaft including a recess on an end of the shaft; (b) a stator that at least partially extends within the rotor; and (c) a compliant member; wherein the compliant member extends into the recess and the compliant member is compliant so that the compliant member allows the shaft to move.

Another possible embodiment of the teachings herein provides: a blower comprising: (a) a rotor, (b) a stator, and (c) a printed circuit board including: (i) one or more electrical feeds and (ii) a plurality of circuitries; wherein substantially all of the plurality of circuitries is located in a region of the printed circuit board that includes the one or more electrical feeds.

One possible embodiment of the present teachings includes: a blower comprising: (a) a rotor including: (i) a magnet and (ii) a shaft; (b) a stator that at least partially extends within the rotor; wherein the magnet and the shaft are permanently connected together.

The present teachings surprisingly solve one of more of these problems by providing an air mover that includes a compliant member that dampens axial movement of the shaft. The present teachings provide a compliant member connected to a shaft that prevents and/or eliminates noise, vibration, and harshness related to movement of the rotor. The present teachings provide an improved circuitry configuration that improves performance of the air mover. The present teachings provide a circuitry configuration that reduces radiation such as electromagnetic waves generated by the air mover.

DETAILED DESCRIPTION

Figure 1:
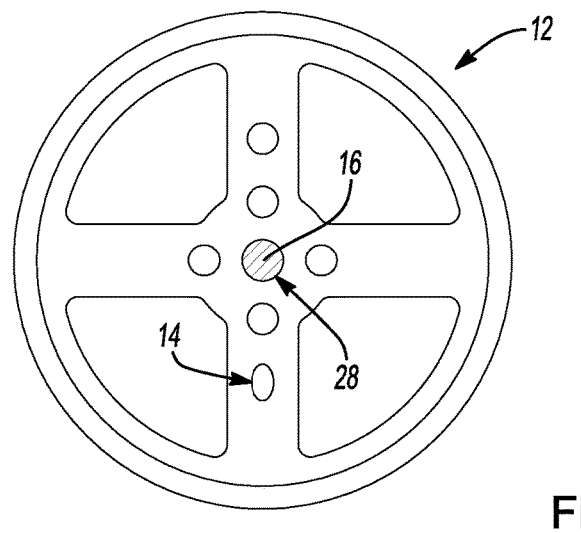
FIG. 1 illustrates a plan view of a cup connected to a shaft.

The explanations and illustrations presented herein are intended to acquaint others skilled in the art with the invention, its principles, and its practical application. Those skilled in the art may adapt and apply the invention in its numerous forms, as may be best suited to the requirements of a particular use. Accordingly, the specific embodiments of the present invention as set forth are not intended as being exhaustive or limiting of the teachings. The scope of the teachings should, therefore, be determined not with reference to the above description, but should instead be determined with reference to the appended claims, along with the full scope of equivalents to which such claims are entitled. The disclosures of all articles and references, including patent applications and publications, are incorporated by reference for all purposes. Other combinations are also possible as will be gleaned from the following claims, which are also hereby incorporated by reference into this written description.

The present teachings may be used with any fan, blower, air mover, similar device that moves air, or a combination thereof. As discussed herein fan, blower, and air mover are used interchangeably and the use of the term fan is intended to encompass a blower, air mover, or any other device that moves a fluid such as air, or a combination thereof. The fan may function to move air from a first location to a second location to provide heat, remove heat, provide cooling, or a combination thereof. The fan may move air within a component. For example, the fan may move air into a cooling cabinet or a housing that includes equipment, electrical components, or both. The fan may be located in a vehicle. Preferably, the fan may be connected to a vehicle seat. The fan may be attached to, located under, or both the bun of a seat, in the back of a seat, or both. The fan may extend into a cushion of a vehicle seat so that the fan is located within the vehicle seat. The fan may be suspended during use (e.g., from an insert, from a seat cushion, from a seat frame, or a combination thereof). Preferably, the fan may be connected to a vehicle battery. The fan may be used in a vehicle to move a fluid through a vehicle seat. More preferably, the fan may be a low profile fan.

The present teachings are predicated upon providing a fan (i.e., a blower) that includes a housing, an impeller, a motor, and control instrumentation (e.g., circuitry). The housing may function to partially and/or fully enclose components of the fan, to generate a pressure differential so that air is moved, protect circuitry, or a combination thereof. The housing may enclose all of the functional components of the fan. The housing may connect the fan to channels, an air source, a thermoelectric device, may include a thermoelectric device, or a combination thereof. The housing may connect the fan to one or more devices so that the fan is retained within a device and/or system. For example, the fan may connect to a seat by the housing so that the fan may move air through the seat. A stator may be connected to the housing so that the stator supports a rotor.

The rotor may function to rotate and move air. The rotor may rotate about an axis. The rotor may be located within and/or include one or more bearings so that the rotor has low friction rotation. The rotor may include an impeller that functions to move air. The impeller may push air, pull air, or both. The impeller may be made of any material so that the impeller moves air. Preferably, the impeller is made of plastic or a light-weight material. The impeller may be made of a molded material, an injection molded material, or both. The impeller may be made of metal. The impeller may be large enough so that the impeller moves a sufficient amount of air to heat and/or cool an occupant, a user, a location of interest, or a combination thereof. The impeller may be sufficiently small so that the rotor fits within a component and preferably a vehicle component. Preferably, the impeller may be formed by injection molding and/or overmolding. The impeller may be molded around a cup, a shaft, or both of the rotor.

The cup may function to substantially surround the stator, house one or more magnets, connect to a shaft, or a combination thereof. The cup may form a connection with the impeller so that the impeller is balanced, the impeller is positioned relative to the shaft, or both. The cup may be fixedly connected to a shaft. The cup may be permanently connected to the shaft. The cup may fixedly connect to one or more magnets so that the magnets are not directly connected to the impeller, the magnets move the impeller around the stator, or both. The cup may be at least partially molded into the impeller, press fit into the impeller, or both.

The one or more magnets may function to move the rotor during operation of the fan. The one or more magnets may rotate about the stator when the windings are activated. The rotor may include a sufficient amount of magnets so that the rotor rotates, air is moved, or both. The one or more magnets may be positioned relative to the stator by the position of the cup, by the connection of the magnets to the cup, or both.

The position of the cup may be determined by a connection with the shaft. The shaft may function to form a movable connection with the stator so that the rotor is movable. The shaft may be press fit into a bearing so that an end of the shaft extends beyond the bearing and so that a bearing surface is created. The bearing surface may be at the end of the shaft that contacts a portion of the housing when the rotor rotates. The bearing surface may be a low friction surface that contacts the housing to support the rotor so that the rotor does not axially move in a first direction and the compliant member may prevent the rotor from extending in a second direction. The shaft may be molded into the impeller so that a connection is formed between the shaft and the cup. The shaft may be press fit into the cup, the impeller, or both so that a connection is formed. Preferably, the shaft is welded to the cup so that a connection is formed. The shaft and cup may be welded together by any welding method so that a fixed connection is formed. The shaft and cup may be welded together by laser welding, ultrasonic welding, friction welding, arc welding, tig welding, solid state welding, or a combination thereof. The shaft and cup may be welded by any method so that the cup is balanced about the cup when a connection is finalized. The weld may add additional material to form the connection. The weld may be free of additional material to form the connection. The shaft may be press fit into the cup and then a weld formed. The weld may only be on the outside of the cup or only on the inside of the cup. The weld may be a continuous weld around an outer periphery of the shaft. The weld may be intermittently located about the shaft. The shaft, the cup, or both may be free of a tapered portion that assists in forming the connection between the cup and the shaft. The cup may extend in a direction substantially perpendicular to the shaft and a connection may be formed so that the cup and shaft remain substantially perpendicular, without the using a tapered portion. The shaft, the cup, or both may include one or more positioning features that may align the cup and shaft relative to each other, relative to the impeller, relative to an impeller mold, relative to a weld structure, or a combination thereof.

The positioning feature may function to align the cup and shaft, the cup and impeller, the cup in a mold, the cup in an assembly, the cup in a welder, the cup and shaft within a fan, or a combination thereof. The positioning feature may be an integral part of the cup; may be added to the cup; may be complementary to a feature of a mold, welder, assembly, manufacturing equipment, assembly equipment, or a combination thereof; may be part of the cup and shaft assembly; or a combination thereof. The positioning feature may be one or more through holes in the cup that align with a feature of a mold. Preferably, the positioning feature is a through hole and/or raised portion of the cup that is unique so that the positioning feature aligns with only one position of the assembly, the cup can only be placed within a mold in one configuration, or both. The positioning feature may be a unique feature of the cup that corresponds to a similar unique feature of the mold so that the cup is aligned within the mold. The positioning feature may align the cup, the shaft, the impeller, or a combination thereof together so that when the rotor is connected to the stator the rotor is balanced, the rotor rotates about the stator, the rotor does not contact the stator, or a combination thereof.

The stator may function to connect the rotor to the housing, to rotate the rotor, or both. The stator may rotate the rotor substantially about its axis. The stator may have one or more windings that move the rotor via the magnets of the rotor. The one or more windings when powered may create an electric field that moves the rotor and impeller so that air is moved. The rotor may be press fit into the stator. The shaft of the rotor may be connected to bearings and then the bearings and shaft may be placed in the stator. The rotor may remain within the bearings, the stator, or both via a compliant member.

The compliant member may function to allow movement along an axis (i.e., axial movement) of the rotor, the shaft, the impeller, or a combination thereof. The compliant member may function to slow axial movement of the rotor, shaft, the impeller, or a combination thereof; to reduce and/or eliminate contact between the rotor and the housing; to reduce a force with which the rotor contacts a housing; or a combination thereof. The compliant member may be connected to the rotor so that the compliant member restricts axial movement of the rotor. Preferably, the compliant member is connected to a base of a shaft (i.e., an end of the shaft opposite the impeller). More preferably, the compliant member is connected to a recess in the base of the shaft. The compliant member may extend into a groove in the shaft that is located above a bearing surface of the shaft. The compliant member may be: circular and the shaft may extend through a hole in the compliant member, "U" shaped, "C" shaped, or a combination thereof. The compliant member may be flexible, may be rigid and include one or more flexible layers, or both. The compliant member may include one or more flexible portions, at least a flexible portion, or both. The entire compliant member may be flexible. The compliant member may have a Shore hardness of about 20 A or more, about 40 A or more, about 70 A or more, or even about 80 A or more (measured according to ASTM D2240). The compliant member may have a Shore hardness from about 20 A to about 100 A (measured according to ASTM D2240). The compliant member may have a Shore hardness of about 100 D or less, about 80 D or less, or about 70 D or less (measured according to ASTM D2240). The compliant member may be a viscous elastic member. The compliant member may be a thermoplastic, a thermoset, vulcanized, or a combination thereof. The compliant member may be partially made of, entirely made of, and/or include an elastomeric material, an elastomer, plastic, rubber, expanded graphite, expanded polytetraflouroethylene (PTFE), vermiculite, carbon fibers, a natural polyisoprene, synthetic polyisoprene, polybutadiene, chloropene, butyle rubber, a halogenated rubber, styrene-butadiene rubber, a nitrile rubber, a hydrogenated nitrile rubber, ethylene propylene rubber, epichlorohydrin rubber, polyacrylic rubber, silicone rubber, fluorosilicone rubber, ethylene-vinyl acetate, perfluoroelastomers, or a combination thereof. The compliant member may be a fiber reinforced material. The compliant member may be a fiber reinforced elastomer. Preferably, the compliant member is flexible so that as the shaft moves axially towards the housing of the fan the compliant member flexes and resists the movement. The compliant member may flex so that contact is prevented between the rotor and the housing (e.g., the top of the impeller and the inside of the housing).

The compliant member may flex so that the rotor is decelerated and any contact between the rotor and the housing is reduced, the force is reduced, or both relative to a shaft that does not include a compliant member. The compliant member may function to absorb kinetic energy so that the compliant member prevents and/or substantially reduces noise, vibration, harshness, or a combination thereof being formed as the rotor moves within the housing, moves into contact with the housing, or a combination thereof. The compliant member restricts axial movement of the fan so that axial movement towards the fan housing is substantially restricted, slowed, reduced, or a combination thereof to reduce an impact between a fan and a housing. For example, if the rotor initially moves with an acceleration of 5 m/s$^2$ and as the compliant member flexes the rotor is decelerated so that the acceleration at the point of contact may be about 0.5 m/s$^2$ or less. The deceleration of the shaft by the compliant member may be exponential as the shaft approaches another blower component. The deceleration of the rotor may reduce the sound produced by the impact between the rotor and housing so that the impact is sufficiently quiet that the occupant, the user, or both cannot hear the sound. The sound produced may be about 62 decibels or less, about 60 decibels or less, about 58 decibels or less, about 56 decibels or less, or about 54 decibels or less. The deceleration of the rotor may reduce the vibrations, the impact, or both of the rotor and housing so that the impact is not felt by the occupant, the user, or both. The compliant member may dampen natural vibrations of the rotor when the rotor is rotating, when the rotor is static and the fan is being moved, or both. The rotor may be restricted by the compliant member so that the rotor moves a distance of about 3 mm or less, about 2 mm or less, about 1 mm or less, or even about 0.5 mm or less. The compliant member may be located proximate to a spacer.

The one or more spacers may be located between the compliant member and a portion of the stator, the bearings, or both. The one or more spacers may be located between a compliant member and another component of the fan a preferably a static member of the fan. Preferably, the one or more spacers are sandwiched between the bearings and the compliant member and the spacer prevents the compliant member from contacting the bearings. The spacer may remove the gap between the compliant member and the bearing so that the bearing and spacer assist in preventing movement of the shaft in the axial direction. The spacer may function to restrict axial movement of the shaft, the rotor, or both. The spacer may be made of the same material as the compliant member, metal, rubber, an elastomer, or a combination thereof. The spacer may be rigid. The spacer may assist in restricting axial movement of the rotor while allowing for rotational movement of the rotor when the control instrumentation is turned on.

The control instrument may include one or more printed circuit board with circuitry (e.g., a microprocessor, thermistor, sensors (i.e. back electromotive force sensors (BEMF), hall sensors, or both), or a combination thereof)). The circuitry may further include diodes, light emitting diodes, reverse polarity diodes, zener diodes, resistors, positive temperature coefficient resistors, negative temperature coefficient resistors, a high resistant resistor, a low resistant resistor, capacitors, a thermistor, or a combination thereof.

The one or more printed circuit boards may include a plurality of circuitries located thereon for controlling the fan.

The one or more printed circuit board may function to provide power to the circuitry so that the circuitry controls the fan. Preferably, the one or more printed circuit boards is one primary printed circuit board. The printed circuit board may be connected to the circuitry using surface mounting. The printed circuit board may include one or more traces and preferably a plurality of traces that extend from the electrical feeds, between pieces of circuitry, or both so that power is supplied to each of the varies pieces of circuitry. The plurality of traces may conduct power, signals, or both from the electrical feeds to the circuitry, between circuitry, or both. The configuration and/or location of the circuitry attached to the printed circuit board may minimize the length of the traces printed on the printed circuit board. The printed circuit board may fit entirely within the foot print of the impeller. Preferably, the printed circuit board fits entirely within a central portion of the impeller (i.e., the portion of the impeller that the blades connect to. The printed circuit board may be symmetrical. The printed circuit board may be asymmetrical. The printed circuit board may include one or more through holes. Preferably, the printed circuit board includes a single through hole. More preferably, the traces do not surround the through hole, pass around the through hole, passing from a first side of the through hole to a second side of the through hole, or a combination thereof. The through hole may be symmetrically located on the printed circuit board. Preferably, the through hole is asymmetrically located on the printed circuit board. Thus, for example, the through hole may divide the printed circuit board so one side is a short side and one side is a long side.

The long side and short side may be separated by a plane that extends through the center of the through hole. The plane may extend substantially perpendicular to the edges of the printed circuit board. Preferably, the plane extends between the edges of the printed circuit board that are along a secondary dimension. The secondary dimension (e.g., width) may be substantially perpendicular to the primary dimension (e.g., length). The plane may bisect the through hole in a way that the length of the printed circuit board is divided into the short side and long side.

The long side of the printed circuit board may function to terminate with the electrical feed, house substantially all of the circuitry and preferably all of the circuitry, or both. The long side may have a sufficient area that substantially all and/or all of the circuitry is located on the long side. The long side may include the electrical feeds, hall effect sensors, windings termination points, motor driver, microprocessor, or a combination thereof. Preferably, the long side includes the electrical feeds and the microprocessor is the closest piece of circuitry to the electrical feeds. One or more diodes, capacitors, or both may be located between the microprocessor and electrical feeds to protect the microprocessor from damage. The long side may include the electrical feeds at a central location so that each of the plurality of hall effect sensors and each of the plurality of winding termination points are equally spaced from the electrical feeds. Stated another way, the distance from the electrical feeds to the hall effect sensors is equal to the distance from electrical feeds to the winding termination points. For example, if the first hall effect sensor has a trace length of 5 mm from the electrical feeds then the first winding termination point has a trace length of 5 mm from the electrical feeds. The circuitry may be arranged on the long side of the printed circuit board based upon the frequency of the circuit components. Preferably, the high frequency circuitry is located closer to the electrical feeds then low frequency circuitry. The configuration of the circuitry on the long side of the printed circuit board may minimize, eliminate, cancel out, or a combination thereof the radiation produced by the fan (e.g., electromagnetic radiation).

The circuitry, trace length, or both may be selected and/or configured on the printed circuit board so that electromagnetic interference created by the circuitry, traces, or both are minimized, reduced, or are cancelled out. The circuitry may be placed on the printed circuit board so that the trace length is minimized and the corresponding electromagnetic inference is minimized. The trace length may be minimized by the traces not extending to the short side, not extending around the through hole, or both. The trace length may be varied according to a tested electromagnetic interference of the system, the traces, one or more components of the circuitry, or a combination thereof. The trace length may be varied based upon a measured immunity, a tested immunity, or both. A maximum trace length and/or configuration may be calculated buy the following formula: Frequency=speed of light/wavelength, where speed of light is a constant speed of 299,792,458 m/s and wavelength is the distance of one cycle of the specific frequency (e.g., wavelength of a 300 MHz signal is about 0.1 m). The frequency may result in an electromagnetic radiation of about 80 dBµv or less, preferably about 60 dB µv, or more preferably about 50 dB µv. The maximum trace length when created using the formula discussed herein may result in an electromagnetic radiation of about 80 dB µv or less, preferably about 60 dB µv, or more preferably about 50 dB µv.

The short side may function to assist in retaining the printed circuit board within the fan. The short side may be substantially free of circuitry, traces, or both (e.g., 40 percent or less, preferably 30 percent or less, or more preferably 20 percent or less, or most preferably 10 percent or less of the circuitry and/or traces are located on the short side). The printed circuit board may include one or more of the following pieces of circuitry.

The fan may include one or more reverse polarity protection diodes. The reverse polarity protection diode may protect the fan, the microprocessor, or both in the event of being hooked up backwards. The fan may include one or more zener diodes. The zener diodes may be installed so that the voltage potential being applied is compatible with the working voltage of the microprocessor. The zener diode may step down the voltage to any voltage that is compatible with operating the fan, microprocessor, or both.

The fan may include one or more negative temperature coefficient (NTC) resistors. The negative coefficient resistors may decrease in resistance as temperature increases so that the fan control is regulated in response to the ambient temperature (i.e., increase in resistance as the temperature decreases).

The thermistor may function to measure a temperature. The thermistor may be any thermistor that measures an ambient temperature. The thermistor may be located at any location in or on the fan so that the thermistor measures the ambient temperature around the fan. The thermistor may provide a temperature signal to the microprocessor. One example of a thermistor may be a negative temperature coefficient resistor as discussed herein. The microprocessor may turn the fan on or off based upon a temperature signal from the thermistor. The microprocessor may receive a signal from the thermistor. The signal from the thermistor may be an electrical signal that may be converted by the microprocessor to a corresponding temperature, which the microprocessor uses to control the blower. The microprocessor may use a look up table to convert the signal to a corresponding temperature. The microprocessor may use a look up table to determine whether the ambient temperature is high or low enough to turn the fan on or off.

FIG. 1 illustrates a magnet 12. The magnet 14 includes a positioning feature 14 that positions the magnet 12 within a cup of a blower (not shown). The magnet 12 further includes a welded connection 28 with a shaft 16.

Figure 2:
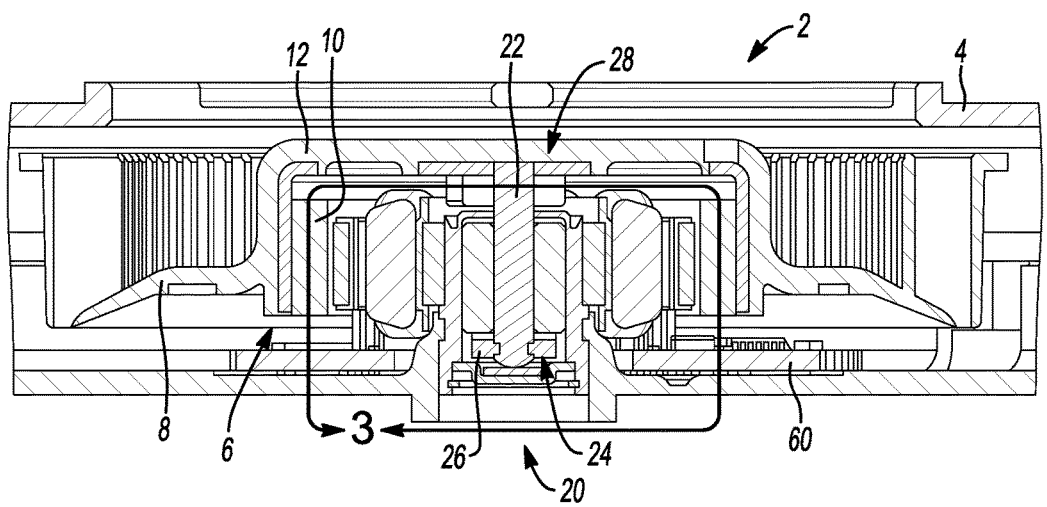
FIG. 2 illustrates a cross sectional view of an example of an air mover.

FIG. 2 illustrates a cross-sectional view of a blower 2. The blower 2 includes a housing 4 that houses a rotor 6 that extends around a stator 20. The rotor 6 includes an impeller 8 for moving air, the impeller 8 includes a cup 10 that is in communication with and is fixedly connected to a magnet 12. The magnet 12 has a welded connection 28 with a shaft 16 so that the shaft 16 and magnet 12 move together. The stator 20 includes windings 24 that surround the shaft 16 so that the windings 24 when energized rotate the rotor 6 by creating an electromagnetic field with the magnet 12. The stator 20 further includes a compliant member 26 that connects the shaft 16 to the stator 20. A portion of the stator 20 and rotor 6 extend through a printed circuit board 60.

Figure 3:
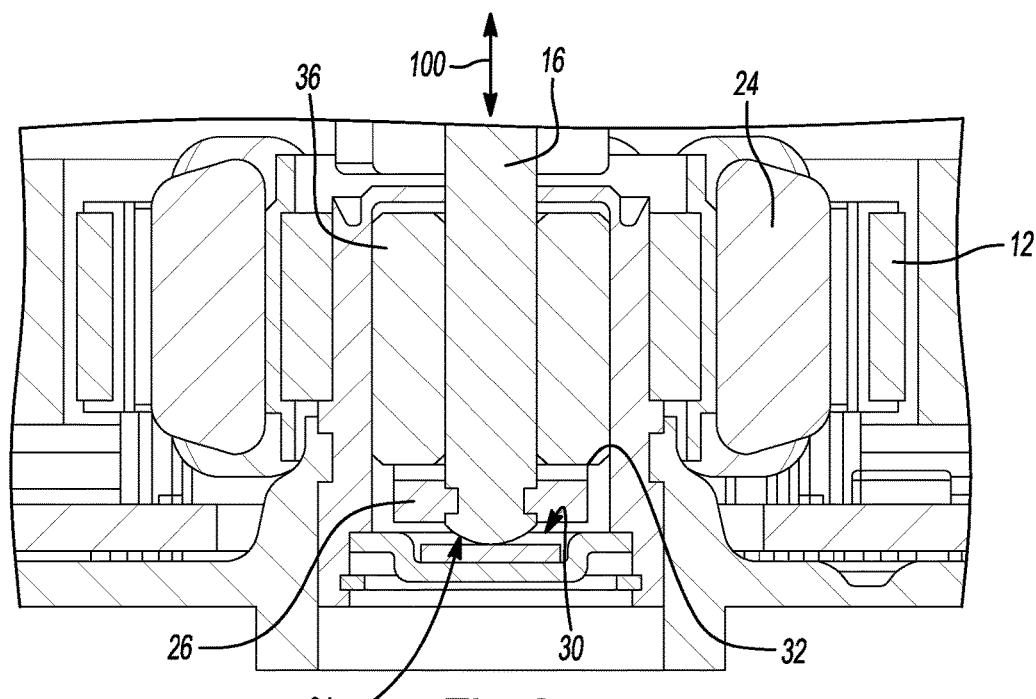
FIG. 3 illustrates a close-up view of an example of a compliant member.

FIG. 3 illustrates a close up view of the shaft 16 and compliant member 26. The shaft 16 includes a groove 34 that the compliant member 26 extends into so that the compliant member 26 and shaft 16 are connected. A spacer 32 is located above the compliant member 26 and below a bearing 36. The compliant member 26 is compliant so that the shaft 16 is movable in the axial direction 100 and/or upon movement of the shaft 16 in the axial direction 100 the compliant member 26 slows movement of the shaft 16. The shaft 16 extends to a point and forms a bearing surface 30 with a portion of the housing so that the shaft 16 has low friction rotation. Magnets 12 are located around the shaft 16 and windings 24 are located between the magnets 12 and shaft 16 so that during operation the magnets are rotated by the windings 24.

Figure 4:
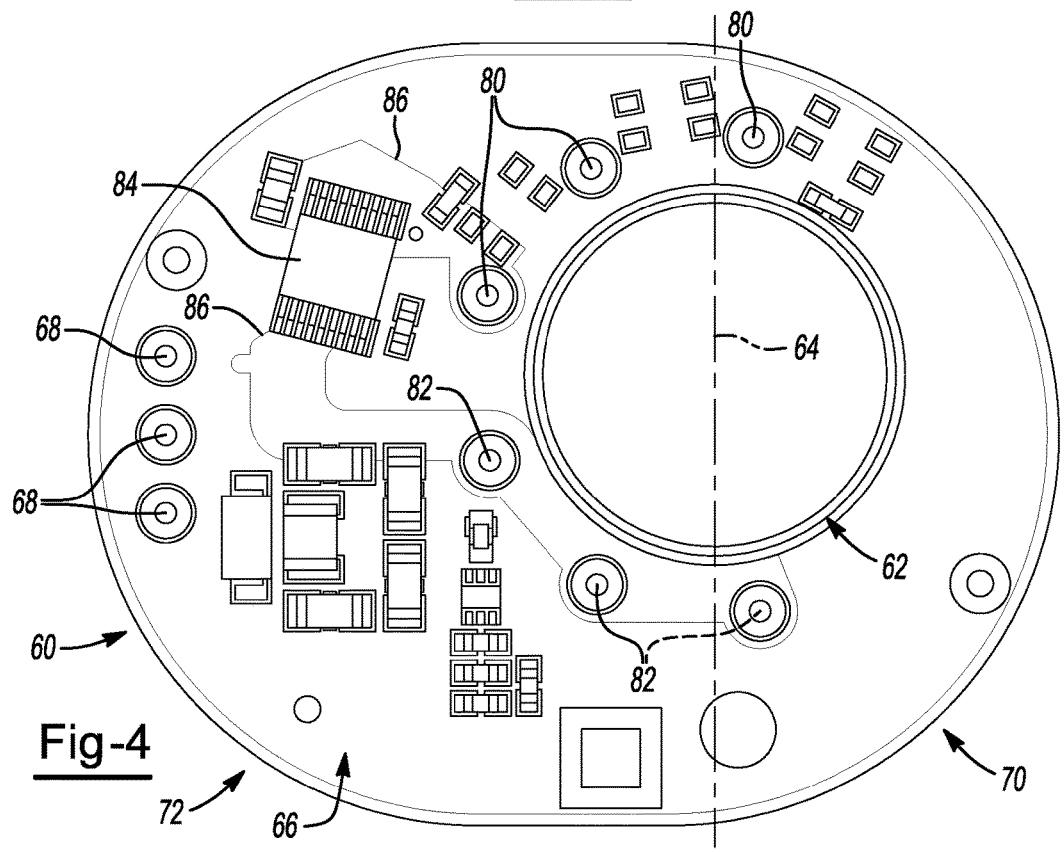
FIG. 4 illustrates a top view of a printed circuit board.

FIG. 4 illustrates a top view of a printed circuit board 60. The printed circuit board 60 includes a through hole 62 that is off center. The through hole 62 is configured to receive a portion of the rotor and/or stator (not shown). The through hole 62 further includes a plane 64 that bisects the through hole 62 along a lateral dimension of the printed circuit board 60. The plane 64 separates a short side 70 and a long side 72 of the printed circuit board 60. The short side 70 of the printed circuit board 60 is free of electrical feeds 68 and is substantially free of circuitry 66. The long side 72 includes substantially all of the circuitry 66 and includes the electrical feeds 68. Some of the circuitry 66 of on the printed circuit board 60 include a plurality of hall effect sensors 80, a plurality of winding termination points 82, and a motor driver 84. As illustrated, the motor driver 84 is located about half way between the hall effect sensors 80 and the winding termination points 82 so that the traces 86 between the hall effect sensors 80 and the motor driver 84 and the traces 86 between the windings termination points 82 and the motor driver 84 are about an equal length.

Figure 5:
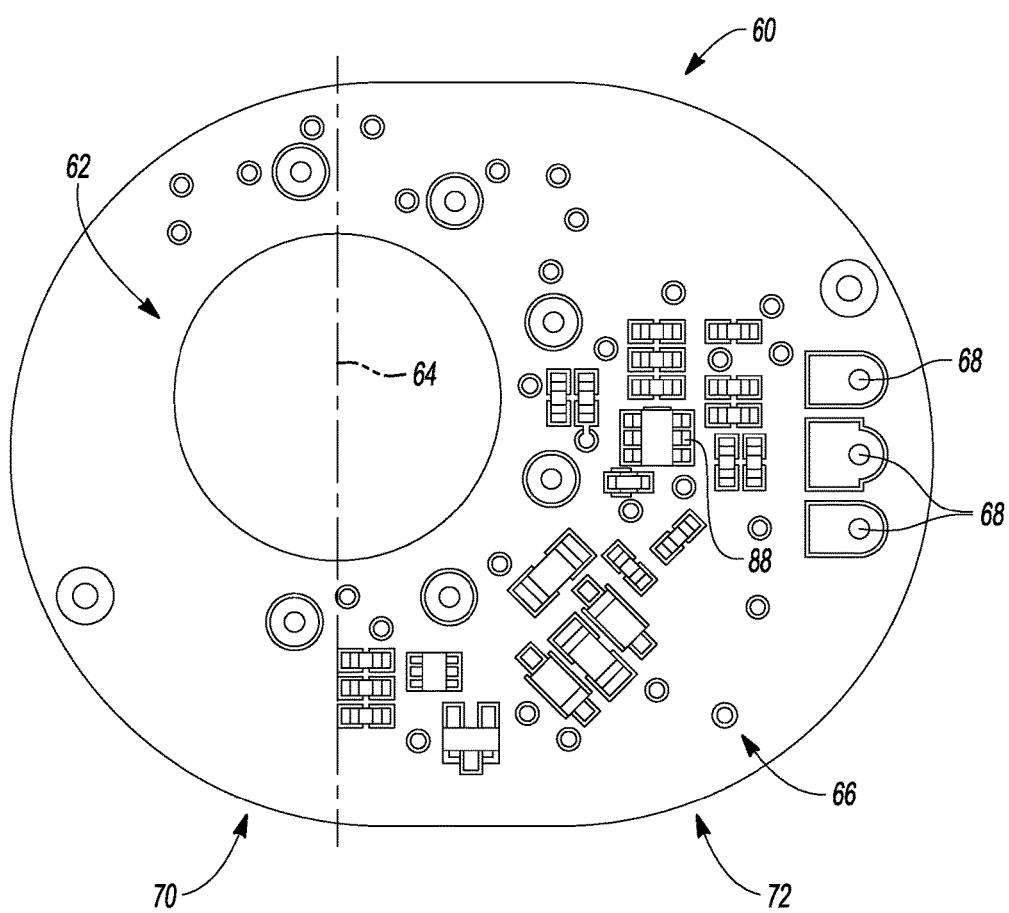
FIG. 5 illustrates a bottom view of a printed circuit board.

FIG. 5 illustrates a bottom view of a printed circuit board 60 having a short side 70 and a long side 72 that are separated by a plane 64 that bisects the through hole 62 along a width of the printed circuit board 60. The long side 72 includes circuitry 66 and electrical feeds 68 and the short side is substantially free of circuitry and electrical feeds. A microprocessor 88 is the closest component to the electrical feeds 68.

Figure 6:
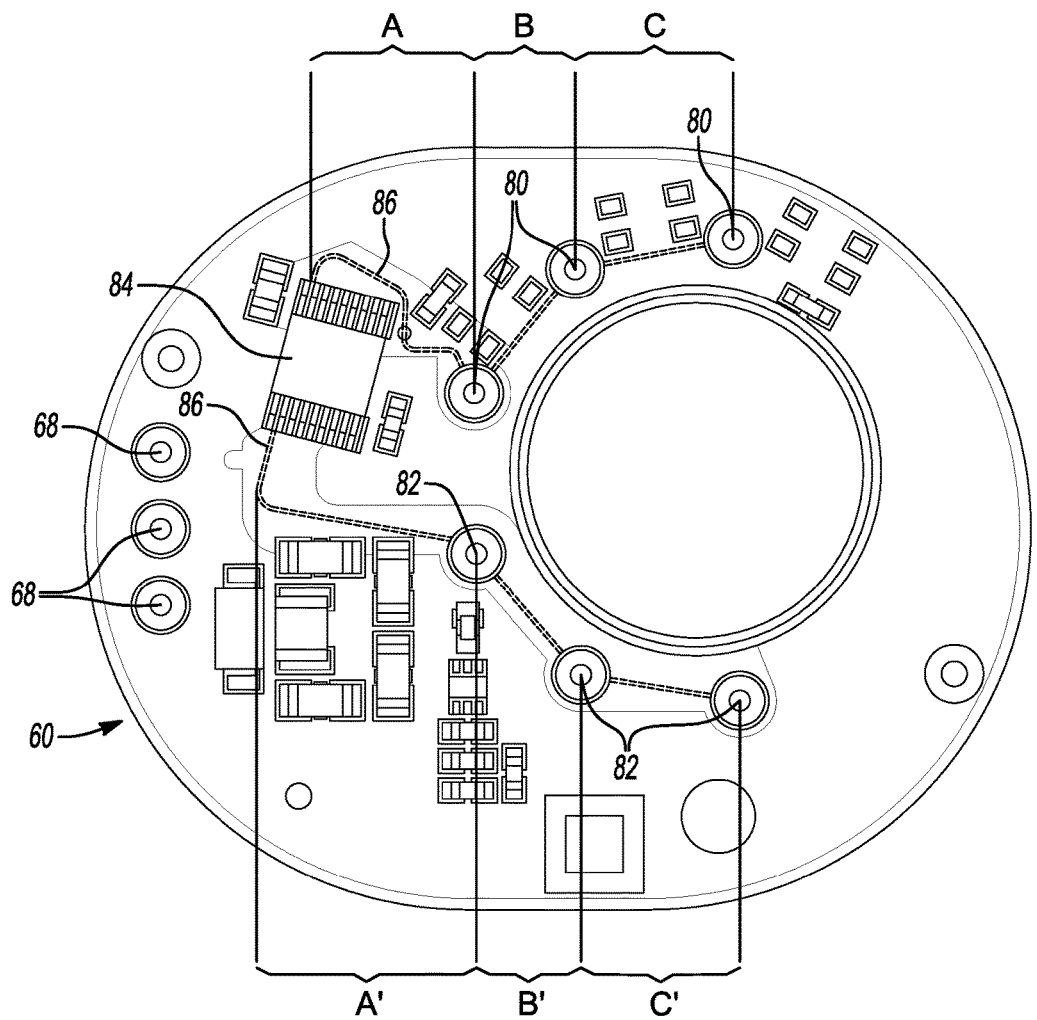
FIG. 6 illustrates a plan view of trace lengths.

FIG. 6 illustrates a top view of a printed circuit board 60. The printed circuit board includes three electrical feeds 68 on one end that supply power through the traces 68 and to the circuitry. As illustrated, the motor driver 84 is connected to a series of hall effect sensors 80 on one side and a series of winding termination points 82 on a second side. The trace extending from the motor driver 84 to the first hall effect sensor 80 has a length A, and the trace extending from the motor driver 84 to the first winding termination point 82 has a length A', where the length A and the length A' are equal. The trace length from the first hall effect sensor to the second hall effect sensor has a length B, and the trace length from the first winding termination point to the second winding termination point has a length B', where the length B and the length B' are equal. The trace length from the second hall effect sensor to the third hall effect sensor has a length C and the trace length from the second winding termination point to the third winding termination point has a length C', where the length C and the length C' are equal.

Any numerical values recited herein include all values from the lower value to the upper value in increments of one unit provided that there is a separation of at least 2 units between any lower value and any higher value. As an example, if it is stated that the amount of a component or a value of a process variable such as, for example, temperature, pressure, time and the like is, for example, from 1 to 90, preferably from 20 to 80, more preferably from 30 to 70, it is intended that values such as 15 to 85, 22 to 68, 43 to 51, 30 to 32 etc. are expressly enumerated in this specification. For values which are less than one, one unit is considered to be 0.0001, 0.001, 0.01 or 0.1 as appropriate. These are only examples of what is specifically intended and all possible combinations of numerical values between the lowest value and the highest value enumerated are to be considered to be expressly stated in this application in a similar manner.

The disclosures of all articles and references, including patent applications and publications, are incorporated by reference for all purposes. The term "consisting essentially of" to describe a combination shall include the elements, ingredients, components or steps identified, and such other elements ingredients, components or steps that do not materially affect the basic and novel characteristics of the combination. The use of the terms "comprising" or "including" to describe combinations of elements, ingredients, components or steps herein also contemplates embodiments that consist essentially of the elements, ingredients, components or steps. By use of the term "may" herein, it is intended that any described attributes that "may" be included are optional.

Plural elements, ingredients, components or steps can be provided by a single integrated element, ingredient, component or step. Alternatively, a single integrated element, ingredient, component or step might be divided into separate plural elements, ingredients, components or steps. The disclosure of "a" or "one" to describe an element, ingredient, component or step is not intended to foreclose additional elements, ingredients, components or steps.

We claim:
1. A blower comprising
   a. a rotor,
   b. a stator, and
   c. an oblong-shaped printed circuit board including:
      i. one or more electrical feeds,
      ii. a plurality of circuitry,
      iii. a through hole that receives a portion of the stator,
      iv. a primary dimension that is centered between edges defining an overall width of the oblong-shaped printed circuit board, and
      v. a secondary dimension that is perpendicular to the primary dimension, the secondary dimension is cen- tered between edges defining an overall length of the oblong-shaped printed circuit board;

wherein a center of the through hole is located off center on the printed circuit board relative to both the primary dimension and the secondary dimension so that a plane bisecting the through hole in a direction parallel to the secondary dimension, creates a short side on one side of the plane and a long side on another side of the plane, and substantially all of the plurality of circuitry is located on the long side in a region of the printed circuit board that includes the one or more electrical feeds.

2. The blower of claim 1, wherein the blower includes a compliant member; wherein the compliant member extends into a recess at an end of a shaft of the rotor and the compliant member is flexible so that the compliant member allows the shaft to move, at least partially moves with the shaft, or both.

3. The blower of claim 1, wherein the compliant member is at least partially made of an elastomeric material and/or includes an elastomer.

4. The blower of claim 1, wherein the compliant member has a Shore hardness of about 20A to about 100A when measured according to ASTM D2240.

5. blower of claim 1, wherein the compliant member allows the shaft to move axially along an axis of the shaft.

6. The blower of claim 1, wherein the compliant member allows the shaft to move so that vibrations, noise, harshness, or a combination thereof are prevented from passing from the shaft to an impeller, the stator, a blower housing, or a combination thereof.

7. The blower of claim 1, wherein the compliant member substantially reduces and/or eliminates acceleration of the shaft axially so that a force between the shaft, the compliant member, or both and an adjacent blower component is substantially reduced and/or eliminated.

8. The blower of claim 7, wherein deceleration of the shaft, the compliant member, or both is exponential as the shaft, the compliant member, or both approach the adjacent blower component so that noise resulting from contact between the compliant member, the shaft, or both is not audible to a user, is eliminated, or both.

9. The blower of claim 1, wherein the short side is free of the plurality of circuitry and all of the plurality of circuitry is located on the long side.

10. The blower of claim 9, wherein the one or more electrical feed are located on the long side of the printed circuit board.

11. The blower of claim 1, wherein the one or more electrical feeds are located on the long side of the printed circuit board.

12. The blower of claim 11, wherein the printed circuit board is oval.

13. The blower of claim 1, wherein the printed circuit board is oval.

14. The blower of claim 1, wherein the rotor is connected to an impeller and the printed circuit board fits entirely within an axial footprint of the impeller.

15. The blower of claim 1, wherein the plurality of circuitry includes a plurality of hall effect sensors, a plurality of winding termination points, and a motor driver, the motor driver is located substantially the same distance from the plurality of hall effect sensors as from the plurality of winding termination points.

16. The blower of claim 15, wherein traces extend from the motor driver to the plurality of hall effect sensors and traces extend from the motor driver to the plurality of winding termination points and the traces extending to the plurality of hall effect sensors are substantially the same length as the traces extending to the plurality of winding termination points.

17. The blower of claim 1, wherein the plurality of circuitry is located on the printed circuit board so that traces of the circuitry are only located within the region that includes the one or more electrical feeds minimizing electromagnetic interference.

18. The blower of claim 1, wherein the plurality of circuitry include high frequency circuitry and a length of traces extending between the high frequency circuitry and the one or more electrical feeds is shorter than a length of the traces and all other of the plurality of circuitry, and wherein the high frequency circuitry has a frequency of about 8MHz or more, is a microprocessor, or both.

* * * * *

UNITED STATES PATENT AND TRADEMARK OFFICE
CERTIFICATE OF CORRECTION

| | | |
|---|---|---|
| PATENT NO. | : 10,113,562 B2 | Page 1 of 1 |
| APPLICATION NO. | : 15/318458 | |
| DATED | : October 30, 2018 | |
| INVENTOR(S) | : Chad Vincent Pacilli et al. | |

It is certified that error appears in the above-identified patent and that said Letters Patent is hereby corrected as shown below:

In the Claims

Column 10, Line 62:
Insert --the rotor and/or-- before "the stator"

Column 11, Line 7:
Delete "dimension, creates" and insert --dimension creates--

Column 11, Line 18:
Delete "Claim 1" and insert --Claim 2--

Column 11, Line 21:
Delete "Claim 1" and insert --Claim 2--

Column 11, Line 24:
Delete "Claim 1" and insert --Claim 2--

Column 11, Line 26:
Delete "Claim 1" and insert --Claim 2--

Column 11, Line 31:
Delete "Claim 1" and insert --Claim 2--

Column 11, Line 24:
Insert --The-- before "blower of Claim 1"

Signed and Sealed this
Eleventh Day of December, 2018

Andrei Iancu
*Director of the United States Patent and Trademark Office*